US007460574B2

(12) United States Patent
Alfano et al.

(10) Patent No.: US 7,460,574 B2
(45) Date of Patent: Dec. 2, 2008

(54) CR³⁺-DOPED LASER MATERIALS AND LASERS AND METHODS OF MAKING AND USING

(75) Inventors: Robert R. Alfano, Bronx, NY (US); Alexey Bykov, Bronx, NY (US); Vladimir Petricevic, New York, NY (US); Mikhail Sharonov, Bronx, NY (US)

(73) Assignee: Research Foundation of the City University of New York, New York, NY (US)

( * ) Notice: Subject to any disclaimer, the term of this patent is extended or adjusted under 35 U.S.C. 154(b) by 314 days.

(21) Appl. No.: 11/338,341

(22) Filed: Jan. 24, 2006

(65) Prior Publication Data

US 2007/0045597 A1    Mar. 1, 2007

Related U.S. Application Data

(60) Provisional application No. 60/645,611, filed on Jan. 24, 2005.

(51) Int. Cl.
    *H01S 3/14* (2006.01)
(52) U.S. Cl. .................. 372/39; 372/41; 372/44.011
(58) Field of Classification Search ............. 372/39, 372/41, 44.011
    See application file for complete search history.

(56) References Cited

U.S. PATENT DOCUMENTS 4,811,349 A    3/1989    Payne et al.
4,932,031 A    6/1990    Alfano et al.
4,987,575 A *  1/1991    Alfano et al. ................. 372/41
5,541,948 A    7/1996    Krupke et al.

FOREIGN PATENT DOCUMENTS

WO    WO 03/100926    * 12/2003

OTHER PUBLICATIONS

Bykov et al. (Flux growth and optical characterization of Cr-doped LiInGeO4 technical paper).*
Angert et al., "Lasing Due to Impurity Color Centers in Yttrium Aluminum Garnet Crystals at Wavelengths in the Range 1.35-1.45 µm," *Soviet J. Quantum Electronics*, 18(1):73-74 (1988).
Brauch et al., "Multiwatt Diode-pumped Yb:YAG Thin Disk Laser Continuously Tunable Between 1018 and 1053 nm," *Opt. Lett.*, 20(7):713-715 (1995).
Chen et al., "Growth Mechanism of Cr:forsterite Laser Crystal with High Cr Concentration," *Optical Materials*, 24:163-168 (2003).
Deka et al., "Laser Performance of $Cr^{4+}:Y_2SiO_5$," *Applied Physics Letters*, 61(18):2141-2143 (1992).
Feldman et al., "Dynamics of Chromium Ion Valence Transformations in Cr,Ca:YAG Crystals used as Laser Gain and Passive Q-switching Media," *Optical Materials*, 24:333-344 (2003).

(Continued)

*Primary Examiner*—Dung T Nguyen
(74) *Attorney, Agent, or Firm*—Darby & Darby, P.C.; Bruce E. Black (57) ABSTRACT

A laser medium includes a single crystal of chromium-doped $LiSc_{1-x}In_xGe_{1-y}Si_yO_4$, where $0 \leq x \leq 1$ and $0 \leq y \leq 1$. Preferably, x and y are not both 0. A laser, such as a tunable near infrared laser, can contain the laser medium.

23 Claims, 7 Drawing Sheets

OTHER PUBLICATIONS

Hazenkamp et al., "Optical Spectroscopy of $Cr^{4+}$-doped $Ca_2GeO_4$ and $Mg_2SiO_4$," *Phys. Rev.*, 53(5):2367-2377 (1996).

Jia et al., "Spectroscopy of $Cr^{3+}$ and $Cr^{4+}$ Ions in Forsterite," *Phys. Rev.*, 43(7):5234-5242 (1991).

Koetke et al., "Quasi-continuous Wave Laser Operation of $Cr^{4+}$-doped $Y_2SiO_5$ at Room Temperature," *Optics Communication*, 101(3,4):195-198 (1993).

Kuck et al., "Tunable Room-Temperature Laser Action of $Cr^{4+}$-doped $Y_3Sc_xAl_{5-x}O_{12}$," *Appl. Phys. B.*, 58:153-156 (1994).

Lai, S. T., "Highly Efficient Emerald Laser," *J. Opt. Soc. Am. B.*, 4(8):1286-1290 (1987).

Mass et al., "Oxygen Activity Dependence of the Chromium (IV) Population in Chromium-doped Forsterite Crystals Grown by the Floating Zone Technique," *J. of Crystal Growth*, 165(3):250-257 (1996).

Moulton, P. F., "Spectroscopic and Laser Characteristics of $Ti:Al_2O_3$," *J. Opt. Soc. Am. B.*, 3(1):125-133 (1986).

Payne et al., "Laser Performance of $LiSrAlF_6:Cr^{3+}$," *J. Appl.Phys.*, 66(3):1051-1056 (1989).

Payne et al., "$LiCaAlF_6:Cr^{3+}$:A Promising New Solid-State Laser Material," *J. Quant. Elect.*, 24(11):2243-2252 (1988).

Payne et al., "Optical Spectroscopy of the New Laser Materials, $LiSrAlF_6:Cr^{3+}$ and $LiCaAlF_6:Cr^{3+}$," *J. Luminescence*, 44:167-176 (1989).

Petricevic et al., "Laser Action in Chromium-activated Forsterite for Near-infrared Excitation: Is $Cr^{4+}$ the Lasing Ion?," *Appl. Phys. Lett.*, 53(26):2590-2592 (1988).

Petricevic et al., "Pulsed Laser Operation of $Cr^{4+}:LiScGeO_4$ at 1.3 µm," CLEO 97, CTuE7 9:30AM, pp. 77-78 (1997).

Petricevic et al., "Room-temperature Near-Infrared Tunable Laser Operation of $Cr^{4+}:Ca_2GeO_4$," *Opt. Lett.*, 21(21):1750-1752 (1996).

Robbins et al., "The System Magnesium Oxide-germanium Dioxide," *Amer. J. Science*, 257:63-70 (1959).

Schafer et al., "Organic Dye Solution Laser," *Appl. Phys. Lett.*, 9(8):306-309 (1966).

Shkadarevich, A. P., "Recent Advances in Tunable Solid State Lasers," *Opt. Soc. Amer.*, 5:60-65 (1989).

Voss et al., "Efficient High-power Diode-pumped Thin-disk Yb:YAG-Laser," *Proc SPIE*, 2426:501-508 (1995).

Walling et al., "Tunable CW Alexandrite Laser," *IEEE J. Quant. Elect.*, QE-16(2):120-121 (1980).

* cited by examiner

CR³⁺-DOPED LASER MATERIALS AND LASERS AND METHODS OF MAKING AND USING

RELATED APPLICATIONS

This patent application claims the benefit of U.S. Provisional Patent Application Ser. No. 60/645,611, filed Jan. 24, 2005, incorporated herein by reference.

STATEMENT REGARDING FEDERALLY SPONSORED RESEARCH OR DEVELOPMENT

This invention was made with government support under Grant No. NCC-1-03009 awarded by NASA and Grant No. W911NF0410023 from the U.S. Department of Defense. The government may have certain rights in this invention.

BACKGROUND

The first tunable lasers were systems using organic dye molecules in solutions. [F. P. Schaefer, W. Schmidt and J. Volze, Organic dye solution laser, *App Phys Lett* 9 (1966), pp. 306-309.] Although these lasers are still operated today, this technology is often not suited to build up small-sized integrated optical systems.

Presently, only a few highly efficient $Cr^{3+}$-doped tunable laser crystals have been developed, such as $Cr^{3+}$:LiS(C)AF ($Cr^{3+}$:LiSrAlF$_6$ and $Cr^{3+}$:LiCaAlF$_6$), emerald $Cr^{3+}$:Be$_3$Al$_2$(SiO$_3$)$_6$ and alexandrite $Cr^{3+}$:BeAl$_2$O$_4$. These lasers are limited and generally tunable in the 600-1000 nm wavelength range.

One of the first tunable solid-state gain media is the alexandrite host (BeAl$_2$O$_4$) doped by $Cr^{3+}$ (U.S. Pat. No. 3,997,853 to R. C. Morris et. al.) which has an emission range of 701-818 nm. [J. C. Walling, O. G. Peterson, H. P. Jensen, R. C. Morris and E. W. O'Dell, Tunable CW alexandrite laser, *IEEE J Quantum Electron* 16 (1980), pp. 120-121.] Today's most frequently used tunable solid-state laser is Ti-sapphire ($\alpha$-Al$_2$O$_3$) offering emission between 670 and 1100 nm, with maximum intensity at about 800 nm. For $Ti^{3+}$, wide emission bands are typically due to a vibronical broadening of the $^2T_2$-$^2E$ absorption. [P. F. Moulton, Spectroscopic and laser characteristics of Ti:Al$_2$O$_3$, *J Opt Soc Am B* 3 (1986), pp. 125-133.] Although a Ti-sapphire system shows many advantages, pumping with, for example, flash lamps is not efficient because of the relatively short lifetime of 3 μs is for the upper laser level. Therefore, pumping is commonly performed by a frequency doubled Nd:YAG (Nd$^{3+}$:Y$_3$Al$_5$O$_{12}$) laser. Such systems can become rather large and may not be particularly suited for integration.

A laser media family which has a similar tuning range as Ti-sapphire is $Cr^{3+}$-doped ternary colquiriites, e.g. LiCaAlF$_6$ (LiCAF) and LiSrAlF$_6$ (LiSAF). [S. A. Payne, L. L. Chase and G. D. Wilke, Optical spectroscopy of the new laser materials LiSrAlF$_6$:Cr$^{3+}$ and LiCaAlF$_6$:Cr$^{3+}$, *J Luminesc* 44 (1989), pp. 167-176; S. A. Payne, L. L. Chase, L. K. Smith, W. L. Kway and H. W. Newkirk, Laser performance of LiSrAlF$_6$:Cr$^{3+}$, *J Appl Phys* 66 (1989), pp. 1051-1056.] In the case of LiCAF, the peak lasing wavelength is at 780 nm with a tuning range from 720 to 840 nm. [S. A. Payne, L. L. Chase, H. W. Newkirk, L. K. Smith and W. F. Krupke, LiCaAlF$_6$:Cr$^{3+}$ a promising new solid-state laser material, *IEEE J Quantum Electron* 24 (1988), pp. 2243-2252.] LiSAF has an even wider tuning range, covering 780-1010 nm. Here, the peak lasing wavelength is at 825 nm. [S. A. Payne, L. L. Chase, L. K. Smith, W. L. Kway and H. W. Newkirk, Laser performance of LiSrAlF$_6$:Cr3+, *J Appl Phys* 66 (1989), pp. 1051-1056.] A broad absorption band around 670 nm allows pumping by laser diodes.

Emerald, $Cr^{3+}$:Be$_3$Al$_2$(SiO$_3$)$_6$, a trivalent chromium activated beryl, is one of the first room-temperature, frequency tunable laser crystals and has stimulated vibronic solid state laser research. (U.S. Pat. No. 4,464,761, Aug. 7, 1981 to R. R. Alfano et. al.) Emerald, like alexandrite operates in a four level, phonon terminated mode and exhibits gain over a 695-835 nm wavelength range. Its broad fluorescence bandwidth, together with a high gain cross section and 65 μs room temperature fluorescence lifetime, make emerald an excellent laser material for high power, Q-switched, or mode-locked operation. Highly efficient quasi-cw (continuous-wave) laser operation has been achieved in emerald over the 720-842 nm tuning range. [S. T. Lai *J. Opt. Soc. Am. B* 4 (1987), p. 1286.]

The development of tunable solid state lasers based on the $Cr^{4+}$-ion began in 1988 with forsterite, Cr:Mg$_2$SiO$_4$. [V. Petricevic, S. K. Gayen and R. R. Alfano. *Appl. Phys. Lett.* 53 (1988), p. 2590.] It was rapidly extended to other crystalline media, such as $Cr^{4+}$-doped Y$_3$Al$_5$O$_{12}$ [N. B. Angert, N. I. Borodin, V. M. Garmash, V. A. Zhiynyuk, A. G. Okhrimchuck, O. G. Siyuchenko and A. V. Shestakov *Soviet Journal of Quantum Electronics* 18 (1988), p. 73], Y$_2$SiO$_5$ [Deka, B. H. T. Chai, Y. Shimony, X. X. Zhang, E. Munin and M. Bass *Applied Physics Letters* 61 (1992), p. 2141], Y$_3$Sc$_x$Al$_{5-x}$O$_{12}$ [S. Kuck, K. Petermann, U. Pohlmann, U. Schonhoff and G. Huber *Applied Physics B* 58 (1994), p. 153], and Ca$_2$GeO$_4$ [V. Petricevic, A. B. Bykov, J. M. Evans and R. R. Alfano *Optics Letters* 21 (1996), p. 1750]. The $Cr^{4+}$-ions in tetrahedral coordination proved to be useful for the realization of room temperature tunable solid-state lasers in the spectral range between 1.1-2 μm. The $Cr^{4+}$-doped lasers exhibit many favorable spectroscopic characteristics that have enabled their use as versatile solid-state laser sources in the 1.1-1.6 μm wavelength range. These include the presence of broad absorption bands that overlap with the output wavelengths of the already existing commercial pump lasers such as Nd:YAG and Ti:sapphire; a 4-level energy structure that allows continuous-wave (cw) as well as pulsed laser operation with low threshold pump powers; and broad emission bands in the near infrared. The broadest tuning ranges obtained to date with some of the $Cr^{4+}$ solid-state lasers are shown in Table 1. Use of various hosts enables the generation of tunable radiation to cover the whole wavelength range between 1.13 and 1.63 μm.

TABLE 1

Broadest tuning ranges obtained with some $Cr^{4+}$ lasers

| $Cr^{4+}$ laser | Tuning range |
| --- | --- |
| $Cr^{4+}$: forsterite | 1130-1367 |
| $Cr^{4+}$: YAG | 1309-1596 |
| $Cr^{4+}$: Y$_3$Sc$_{0.5}$Al$_{4.5}$O$_{12}$ | 1394-1628 |
| $Cr^{4+}$: Y$_3$ScAl$_4$O$_{12}$ | 1464-1604 |
| $Cr^{4+}$: Ca$_2$GeO$_4$ | 1340-1490 |

BRIEF SUMMARY

One embodiment is a laser medium comprising a single crystal of chromium-doped LiSc$_{1-x}$In$_x$Ge$_{1-y}$Si$_y$O$_4$, where $0 \leq x \leq 1$ and $0 \leq y \leq 1$. Preferably, x and y are not both 0.

Another embodiment is a laser, such as a tunable near infrared laser, that contains the laser medium.

Yet another embodiment is a method of making a laser medium by forming a solution comprising at least one substituent for forming the laser medium disposed in a solvent. The at least one substituent is selected from metal oxides, metal chlorides, and metal fluorides. At least one crystal of chromium-doped $LiSc_{1-x}In_xGe_{1-y}Si_yO_4$ is formed from the solution, where $0 \leq x \leq 1$ and $0 \leq y \leq 1$. Preferably, x and y are not both 0. In one example, the laser medium is formed by providing a substrate and forming a layer of chromium-doped $LiSc_{1-x}In_xGe_{1-y}Si_yO_4$ on the substrate by liquid phase epitaxy.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description, which is to be read in association with the accompanying drawings, wherein.

DETAILED DESCRIPTION

A laser medium (i.e. material) can be a dielectric crystal doped with trivalent chromium ($Cr^{3+}$) and characterized by a large Stokes shift and high quantum efficiency for the $Cr^{3+}$ lasing ions. Such laser media includes $Cr^{3+}$-doped materials of olivine-like or any other structure with specifically distorted octahedral sites occupied by $Sc^{3+}$, $In^{3+}$, (for example Li(Sc, In)(Ge, Si)$O_4$), or any other ion of appropriate ionic radius to be substituted by a $Cr^{3+}$ lasing ion. For example, the laser medium can be $LiSc_{1-x}In_xGe_{1-y}Si_yO_4$ where $0 \leq x \leq 1$ and $0 \leq y \leq 1$. In one embodiment, x and y are not both 0. In another embodiment, x is 1 and y is 0 (i.e., $LiInGeO_4$). In yet another embodiment, $0.1 \leq x \leq 1$. In further embodiments, y is 0.

In some embodiments, the single crystal can have at least 0.05 wt. % chromium and may have at least 0.1 wt. %, 0.5 wt. %, or 1 wt. % chromium or more. In some embodiments, the single crystals have 1 to 5 wt. % chromium. Preferably, at least 50 mol. % of the chromium ions are $Cr^{3+}$. More preferably, at least 75 mol. % of the chromium ions are $Cr^{3+}$. Most preferably, substantially all of the chromium ions are $Cr^{3+}$.

The laser medium can be produced using a variety of methods including, for example, high-temperature solution crystal growth techniques that enable the growth of crystal below its melting point temperature by using low melting point oxide, fluoride and/or chloride compounds as a solvent.

Suitable laser media include those containing trivalent chromium ($Cr^{3+}$) ions occupying distorted octahedral sites in certain germanate/silicate crystals. These crystals provide a large Stokes shift and are suitable for tunable laser applications in the near infrared (NIR) wavelength range, for example, in the range of 1150-1600 nm.

For example, tunable laser operation is demonstrated for Cr:$LiInGeO_4$ crystals. The unexpected presence of $Cr^{3+}$ along with $Cr^{4+}$ ions was discovered. While not wishing to be bound by any particular theory, it is thought that the laser-active centers in Cr-doped $LiInGeO_4$ crystals are $Cr^{3+}$ in octahedral sites with mirror-symmetry. It may be difficult to separate $Cr^{3+}$ and $Cr^{4+}$ absorption bands using only absorption spectroscopy data because the absorption spectrum of $Cr^{3+}$ overlaps with the absorption of $Cr^{4+}$ centers. Laser action of Cr:$LiScGeO_4$ crystals was previously incorrectly assigned to the tetrahedral $Cr^{4+}$ centers. [V. Petricevic, A. B. Bykov J. M. Evans. A. Seas, A. Delgado, R. R. Alfano, G. V. Kanunnikov, CLEO 97, CTuE7, p. 77.] It is now believed that the laser-active centers in Cr:$LiScGeO_4$ are also $Cr^{3+}$ in distorted octahedral sites with mirror-symmetry. This is the first demonstration of $Cr^{3+}$ laser operation in the important telecommunications range of 1.3 μm. Ultra-wide range of tunability and high quantum efficiency make these crystals promising media for optical lasers, amplifiers and ultrashort pulse generation in the near-infrared range of the electromagnetic spectrum.

$LiScGeO_4$ and $LiInGeO_4$ belong to the olivine group of crystals, similar to the above-mentioned laser crystals $Mg_2SiO_4$ (forsterite) and $Ca_2GeO_4$ (cunyite). Pnma notation of the crystal space group indicates a rectangular primitive cell with unequal lattice constants a, b, and c, where a is the longest axis, b is a middle axis and c is the shortest axis. There are two major types of sites in the lattice: distorted octahedra and distorted tetrahedra. Chromium in Cr-doped forsterite can occupy both octahedral ($Cr^{3+}$) and tetrahedral ($Cr^{4+}$) positions. The relative content of $Cr^{3+}$ and $Cr^{4+}$ depends, at least in part, on growing conditions. In forsterite, $Cr^{4+}$ in tetrahedral positions is responsible for laser action, while $Cr^{3+}$ in octahedral coordination has typically not been found to be a lasing ion due to the overlapping of the $Cr^{3+}$ emission with the absorption of divalent and tetravalent centers. Formation of $Cr^{3+}$ centers in cunyite is reduced or avoided by, for example, replacing the $Mg^{2+}$ ion with the much larger $Ca^{2+}$ ion. In $LiScGeO_4$ and $LiInGeO_4$ both octahedral and tetrahedral centers can be occupied by chromium in trivalent and tetravalent states, respectively. By careful analysis of the spectroscopic data for Cr-doped $LiScGeO_4$ and $LiInGeO_4$ it has been found that lasing in the 1150-1600 nm range is attributable to $Cr^{3+}$ ions in octahedral sites and not $Cr^{4+}$ ions in tetrahedral sites.

Figure 1A:
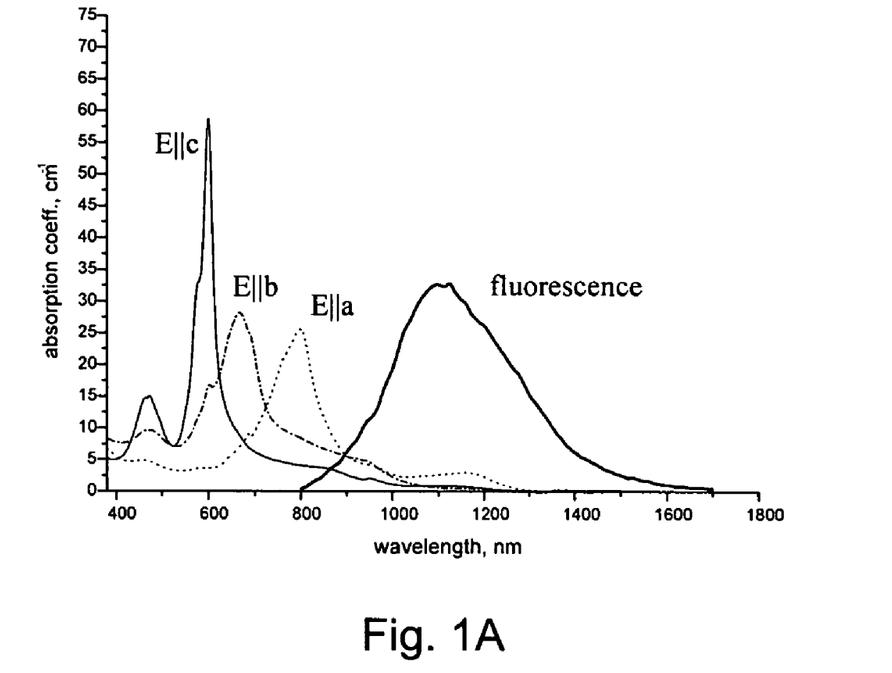
FIGS. 1A and 1B are room temperature polarized absorption spectra (E∥a polarization is shown by dotted line, E∥b polarization is shown by dashed line and E∥c polarization is shown by solid line) and fluorescence spectra of chromium-doped $LiScGeO_4$ and $LiInGeO_4$, respectively.
Figure 1B:
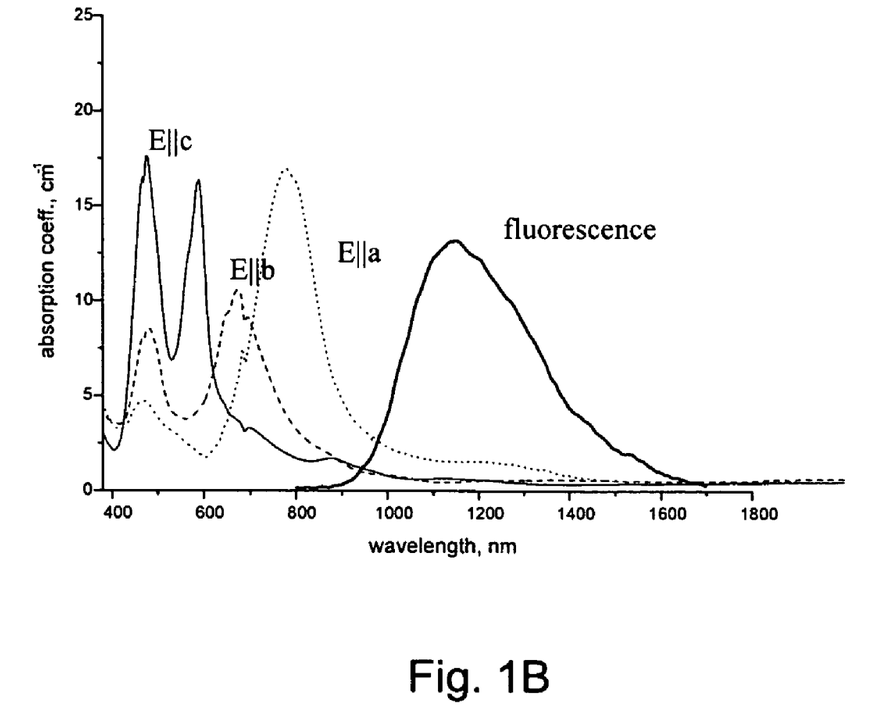

FIGS. 1A and 1B show polarized absorption spectra of Cr-doped LiScGeO$_4$ and LiInGeO$_4$ crystals at room temperature, respectively. The E||a polarization is shown by dotted line, the E||b polarization is shown by dashed line, and the E||c polarization is shown by thin solid line. Spectra for both chromium-doped species are roughly similar to the spectra of Cr$^{4+}$ doped forsterite (Mg$_2$SiO$_4$) and cunyite (Ca$_2$GeO$_4$), except for an absorption band at 500 nm. Absorption bands at ~600 nm, ~700 nm and ~800 nm are attributed to the low-symmetry components of the $^3T_1$ tetrahedral state of the Cr$^{4+}$ ion. Since there are both Cr$^{3+}$ and Cr$^{4+}$ centers in the lattice, these absorption bands are not "pure" Cr$^{4+}$ bands. There is also a Cr$^{3+}$ absorption in the range of 600-1000 nm. To reveal the bands attributed to Cr$^{3+}$ centers, excitation spectroscopy can be used. Absorption bands at 1000-1300 nm are attributed to the components of $^3T_2$ tetrahedral state of Cr$^{4+}$. This assignment is similar to those for other olivine crystals. [W. Jia, H. Liu, S. Jaffe, and W. M. Yen, Phys. Rev. B 43, 5234 (1991), M. F. Hazenkamp, H. U. Güdel, M. Atanasov, U. Kesper, D. Reinen, Phys. Rev. B. 53, 2367 (1996).] A band at 500 nm is not observed in Cr$^{4+}$ doped forsterite and cunyite, but exists in Cr$^{3+}$ doped forsterite, which suggests that this band is due to Cr$^{3+}$ transitions.

Room temperature fluorescence spectra upon excitation with 670 nm laser diode are shown by the solid thick line in FIGS. 1A and 1B for Cr:LiScGeO$_4$ and Cr:LiInGeO$_4$ crystals, respectively. Maxima of the broadband structureless spectra are located at 1100 nm and 1153 nm for LiScGeO$_4$ and LiInGeO$_4$ crystals, respectively. The left (shorter wavelength) sides of the emission spectra overlap with the absorption bands at 1000-1400 nm which are attributed to $^3T_2$ transitions of the Cr$^{4+}$ ion.

In contrast to forsterite and cunyite crystals, no emission was detected upon excitation of the $^3T_2$ band of Cr$^{4+}$ (tested with pumping by a Nd:YAG laser at 1064 nm and a laser-diode at 985 nm) even at 10 K. The lack of emission from Cr$^{4+}$ centers in these crystals under pumping at 985 nm and 1064 nm can be explained by strong nonradiative quenching. This is rather unusual for germanate and silicate olivines, but was observed in other Cr$^{4+}$ doped crystals.

Figure 2A:
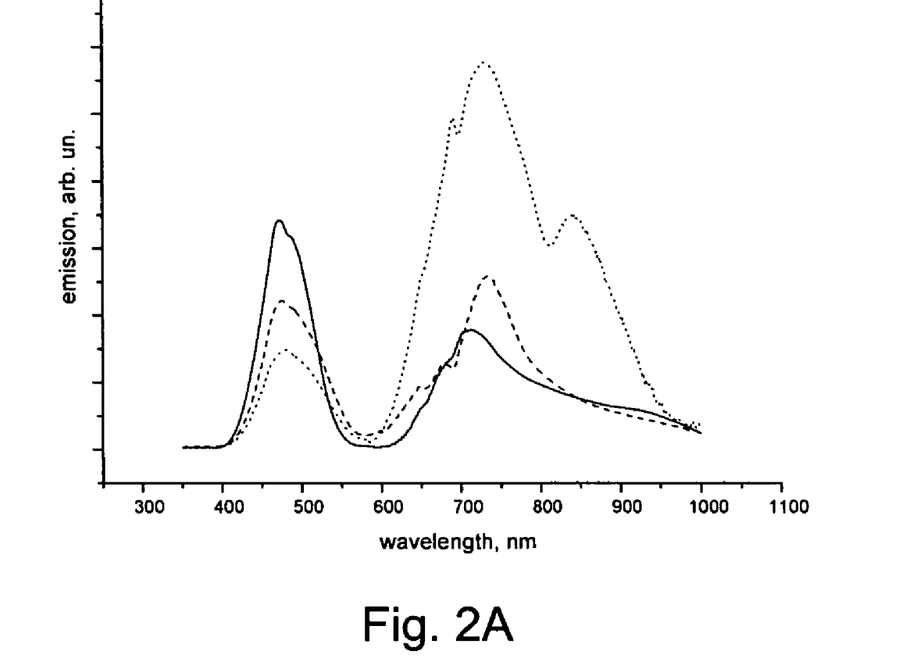
FIGS. 2A and 2B are polarized excitation spectra (E∥a polarization is shown by dotted line, E∥b polarization is shown by dashed line and E∥c polarization is shown by solid line) for emission at the maximum of the fluorescence bands of chromium-doped $LiScGeO_4$ and $LiInGeO_4$, respectively.

FIG. 2A shows polarized excitation spectra for Cr-doped LiScGeO$_4$ crystals monitored at the peak of the fluorescence band at ~1200 nm. There are two bands in the excitation spectrum located at ~480 nm and ~780 nm. Positions of the maxima of these bands do not depend on polarization. This effect is typical for Cr$^{3+}$ ions in an octahedral environment.

In both absorption and excitation spectra there is a sharp line at ~684 nm for E||a. This line is attributed to a spin-forbidden $^2E$-$^4A_2$ transition of the Cr$^{3+}$ ion. In contrast to spin-allowed transitions, the position of the $^2E$ energy level depends only slightly on the strength of the crystal field and a similar $^2E$ level is observed in many Cr$^{3+}$ doped materials at ~680-700 nm. Comparison of polarized absorption spectra (where there are several bands at ~480 nm, ~600 nm, ~700 nm, and 1000-1200 nm) with excitation spectra of emission (with only two bands, which are typical for Cr$^{3+}$ in octahedral coordination) shows that in Cr:LiScGeO$_4$ chromium occupies two positions: Cr$^{4+}$ in tetrahedral sites and Cr$^{3+}$ in octahedral sites. Bands attributed to both Cr$^{3+}$ and Cr$^{4+}$ appear in the absorption spectrum, while the fluorescence originates only from the Cr$^{3+}$ centers.

Figure 2B:
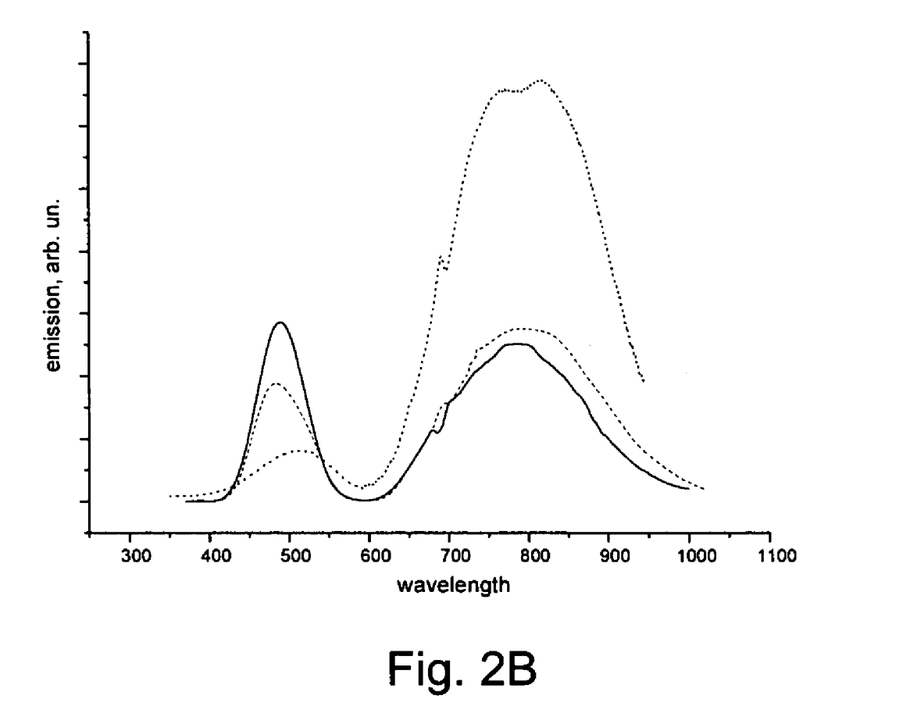

A Cr$^{3+}$ absorption band at ~780 nm is hidden under the strong absorption band of Cr$^{4+}$. The band at ~780 nm in the excitation spectrum is affected by strong absorption of Cr$^{4+}$ centers, which explains the structure of the 780 nm excitation band. FIG. 2B shows similar fluorescence excitation spectra for LiInGeO$_4$. Similar to LiScGeO$_4$ there are two bands attributed to Cr$^{3+}$ transitions. The excitation band at ~800 nm in LiInGeO$_4$ shows less structure compared to that in LiScGeO$_4$ because it is less affected by the Cr$^{4+}$ absorption due to a higher Cr$^{3+}$/Cr$^{4+}$ ratio in this crystal and a smaller size of the crystals.

For demonstration of laser operation a 1.5-mm thick LiScGeO$_4$ plate and a 0.89-mm thick LiInGeO$_4$ plate were used. In both crystals the crystallographic α-axis (longest) was located in the plane of the plates. The pump source was a free-running, gain-switched Ti$^3$+:Al$_2$O$_3$ laser pumped by a Q-switched Nd:YAG laser with a repetition rate of 10 Hz and a maximum pump pulse energy of ~9 mJ. Samples were pumped in the E||a polarization. The resonator included a flat back mirror and an output mirror with a 30 cm radius of curvature. Two different sets of mirrors (with different reflective coatings covering different wavelength ranges) were used to cover the whole range of tunability. The crystal plates were placed near the flat mirror and were end-pumped through the flat mirror. The pump beam was focused with a 25-cm focal lens to a spot size of ~500 μm. A birefringent plate was inserted in the cavity to tune the wavelength of the laser output. In both crystals, laser radiation is polarized along the a-axis.

Figure 3A:
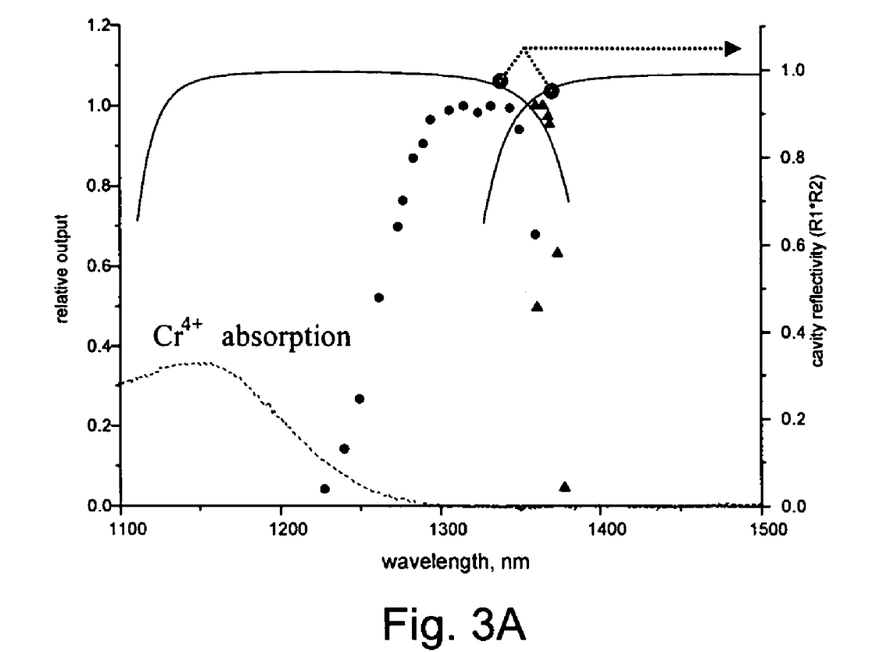
FIGS. 3A and 3B illustrate the range of tunability for chromium-doped $LiScGeO_4$ and $LiInGeO_4$, respectively where experimental data are shown by solid circles and triangles for two sets of mirrors, in which the reflectivity of the cavity R1*R2 (where R1 and R2 are reflectivity of the output and back mirrors) is shown by solid line; and the dashed line shows absorption of $Cr^{4+}$ centers for E∥a polarization.
Figure 3B:
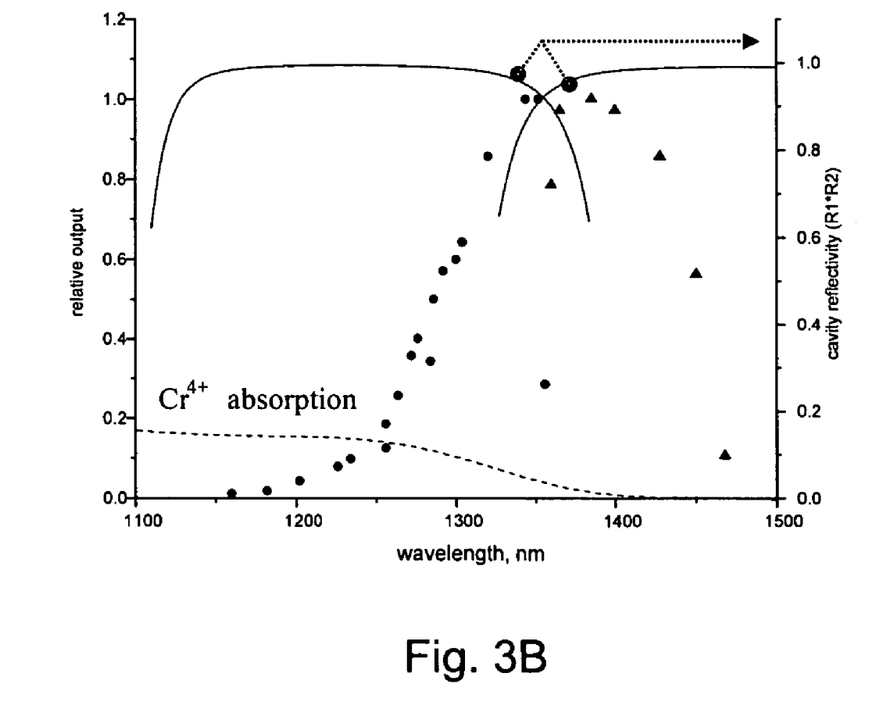

FIGS. 3A and 3B show the tunability characteristics of laser action for LiScGeO$_4$ and LiInGeO$_4$, respectively. The range of tunabilty for these samples is 1150-1480 nm for Cr:LiInGeO$_4$ and 1220-1380 nm for LiScGeO$_4$. In both crystals the fluorescence spectrum starts at ~900 nm, while lasing begins only from 1150 nm for Cr:LiInGeO$_4$ and 1220 nm for Cr:LiScGeO4 crystals. The tuning range is most likely limited due to $^3T_2$-$^3A_2$ Cr$^{4+}$ absorption in the shorter-wavelength range of emission.

In Cr$^{4+}$-free samples, the short-wavelength limit of the range of tunability can be extended to ~1000 nm with a bandwidth exceeding 500 nm. This laser bandwidth can enable generation of pulses as short as ~4 fs. This is the first demonstration of Cr$^{3+}$ lasing operation within the range of 1100-1500 nm which includes the important telecommunications wavelength of 1.3 μm.

Figure 4:
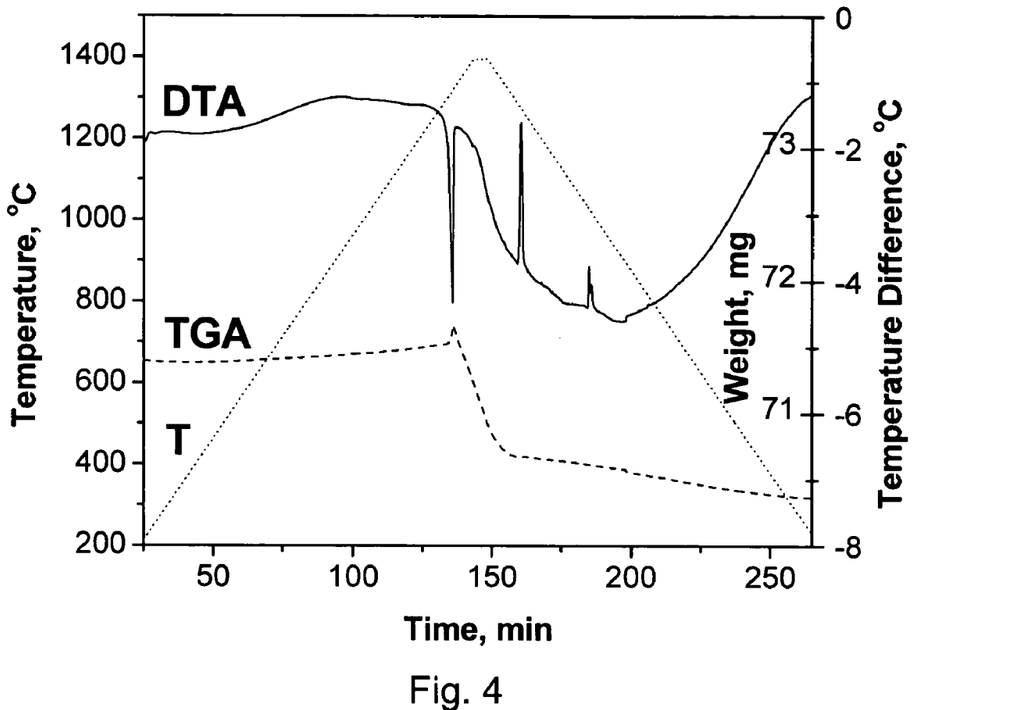
FIG. 4 is a graph of a differential thermal analysis for a $LiInGeO_4$ powder sample.

The thermodynamic (phase) characteristics of these material were investigated using differential thermal analysis (DTA) and X-ray powder diffraction techniques. The resulting data is shown in FIG. 4. As can be seen from FIG. 4, the endothermic peak at 1250° C. during heating is related to melting. Considerable weight loss straightway after melting (see TGA curve in FIG. 4) occurred due to evaporation of Li-germanates characterized by low melting point and high vapor pressure at 1250° C. The presence of two exothermic peaks upon cooling down can be attributed to crystallization of different phases, what suggests incongruent melting. Direct observation of the melting behavior of the Cr:LiInGeO$_4$ powder during the heating process was also performed using a Czochralski crystal growth furnace (RF-power supply, iridium crucible, N$_2$ atmosphere, optical pyrometer temperature control). Melting of the powder was observed at temperatures over 1200° C. Heating above 1200° C. under air, as well as under a nitrogen atmosphere, led to discernible evaporation that increased drastically with increasing the temperature.

The best results for crystal growth of Cr:LiInGeO$_4$ were achieved when Bi$_2$O$_3$-based solvents were used. A significant increase in solubility, and good crystal growth for Cr:LiInGeO$_4$ was found in the LiInGeO$_4$ (1 wt % Cr$_2$O$_3$)—LiBiGeO$_4$—Bi$_2$O$_3$ system. Study of the phase equilibrium in the LiInGeO$_4$ (1 wt % Cr$_2$O$_3$)—LiBiGeO$_4$—Bi$_2$O$_3$ system showed that primary crystallization of the Cr: LiInGeO$_4$ olivine phase takes place in the temperature range from 1050 to 850° C. An appearance of an adjoining phase, dark cube-like crystals of (LiInO$_2$), that co-precipitated together with the orthorhombic olivine phase, during the slow cooling procedure, was observed when the LiInGeO$_4$ concentration was greater then about 40 mol. %. Crystallization of Bi-based germanates (yellow needles, not-identified composition) with low melting points occurred below 850° C. These crystals are easily dissolved in hydrochloric acid.

Figure 5:
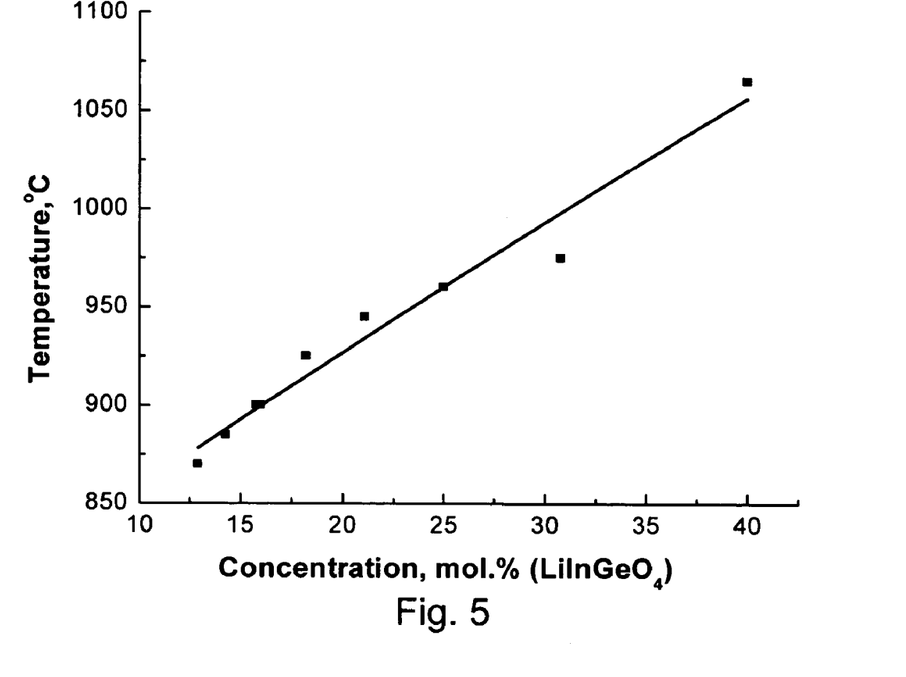
FIG. 5 is a graph of a solubility curve for $LiInGeO_4$ in $LiBiGeO_4$—$Bi_2O_3$ solvent.

The temperature dependence of solubility of Cr:LiInGeO$_4$ in LiBiGeO$_4$—Bi$_2$O$_3$ was measured using the probe-seeding technique. The saturation temperatures were determined for various compositions in the range from 40 mol % to 13 mol % by adjusting the temperature of solution until a probe seed showed no change in surface micro-morphology after a few hours immersion. The results are shown in FIG. 5.

Laser materials can be formed by a variety of methods including, but not limited to, liquid phase epitaxy. For oxide materials, one example of the LPE process is the following: The constituents of the solution are melted in a platinum crucible at about 50-100° C. above the saturation temperature. For example, the solution can include a solvent and stoichiometric quantities of the desired reactants, such as germanium oxide, silicon oxide, lithium oxide, indium oxide, scandium oxide and chromium oxide (or mixed oxides such as LiInGeO$_4$, LiScGeO$_4$, LiInSiO$_4$, LiScSiO$_4$, LiSc$_{1-x}$In$_x$Ge$_{1-y}$Si$_y$O$_4$, or the like) in the desired stoichiometric amounts. Before growth, the melt is stirred to provide complete dissolution of solute components. The substrate is mounted horizontally on a platinum holder and preheated in the furnace. The substrate has an alternate rotation of 50-100 rpm with a change every 5-10 s. Before dipping, in order to limit the temperature fluctuations, the substrate is to stay a few minutes above the melt. During growth, the melt temperature is kept constant. After the growth a rapid speed rotation (800 rpm) should be used in order to eliminate the solvent droplets. Then the substrate is pulled out of the furnace slowly in order to avoid thermal stresses.

In another example of a method of making laser materials, a 100 cm$^3$ Pt crucible filled with LiInGeO$_4$ (3 wt % Cr$_2$O$_3$)—LiBiGeO$_4$—Bi$_2$O$_3$ mixture, having an initial concentration of 30 mol. % LiInGeO$_4$, was placed in a top-loaded single-zone furnace in an air atmosphere and "soaked" 24 hr at 1070° C. for homogenization. Then the furnace temperature was brought to the near-saturation temperature (970° C.) at the rate of 50° C./hr, and then a slow cooling temperature ramping program was turned on. A series of spontaneous runs were performed with a cooling rate from 1.0° C./hr to 0.5° C./hr and different vertical temperature gradients. The preferred spontaneous nucleation position was varied from the surface to the bottom by adjustment of the vertical temperature gradient. The density of Cr:LiInGeO$_4$ crystals is significantly lower than the melt density and crystallization on the surface. Large plate-like crystals were formed on the melt surface when the crucible was placed in the middle depth of a tube furnace, the position characterizing the most uniform vertical temperature distribution. Bulk crystals of size up to 1×1×2 cm$^3$ grew on the bottom of the crucible when it was placed in the lowest position of the tube furnace. There the vertical temperature gradient was about ~10° C./cm. Although the crystals were severely solvent-entrapped, under cooling condition of 0.5° C./hr, relatively large Cr:LiInGeO$_4$ transparent plates, suitable for spectroscopic and laser measurements were prepared. The lattice parameters of Cr: LiInGeO$_4$ crystals were found to be: a=5.018 Å, b=10.739 Å, c=6.094 Å. The crucible was not sealed and the total loss of material by evaporation did not exceed 5 wt. % during a 6 day crystal growth period.

Figure 6A:
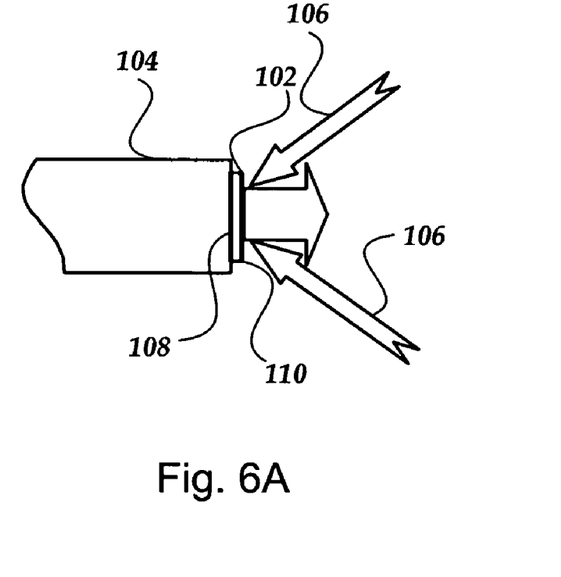
FIG. 6A is a schematic illustration of a first embodiment of a laser, according to the invention.
Figure 6B:
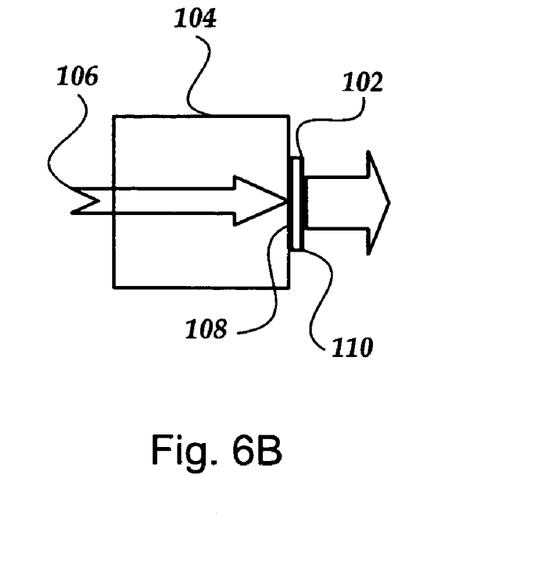
FIG. 6B is a schematic illustration of a second embodiment of a laser, according to the invention.

FIGS. 6A and 6B illustrate two different designs for using the laser medium in a thin disk or slab laser system depending on pumping geometry. In at least some embodiments, the disk or slab has a maximum thickness in the range of, for example, 100 to 1000 μm. In both concepts the dielectric mirror coatings 108, 110 on the disk itself define the resonator of the oscillator. In the first configuration (FIG. 6A), the cooled face of the disc 102 is optically coated to act as a total reflector, the disk is mounted on a heat sink 104 (e.g., a copper heat sink), and pumping light 106 is directed to the front disk surface. In another configuration (FIG. 6B), the cooled face of the disk 102 is transparent to pumping radiation and highly reflecting for laser emission, the laser disk is mounted on a transparent heat sink 104 (e.g., a sapphire heat sink) and axial back pumping light 106 is directed through the transparent sapphire heat sink.

In a modified version (FIG. 7) of the first configuration, the cooled face of the disk 102 (in this embodiment, a wedge slab) is optically coated to act as a total reflector. The wedge slab can be used as an active element to increase pump efficiency. The reflective coatings 108, 110 are on different components of the laser forming a resonator cavity 112. The disk 102 also includes an antireflective coating 114 on the surface that receives the pumping light 106.

Figure 7:
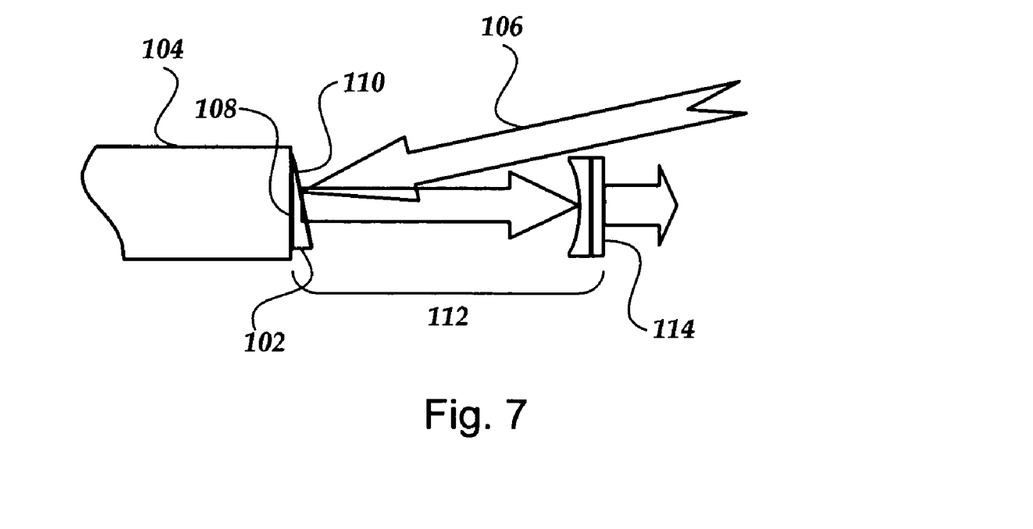
FIG. 7 is a schematic illustration of a third embodiment of a laser, according to the invention.
Figure 8A:
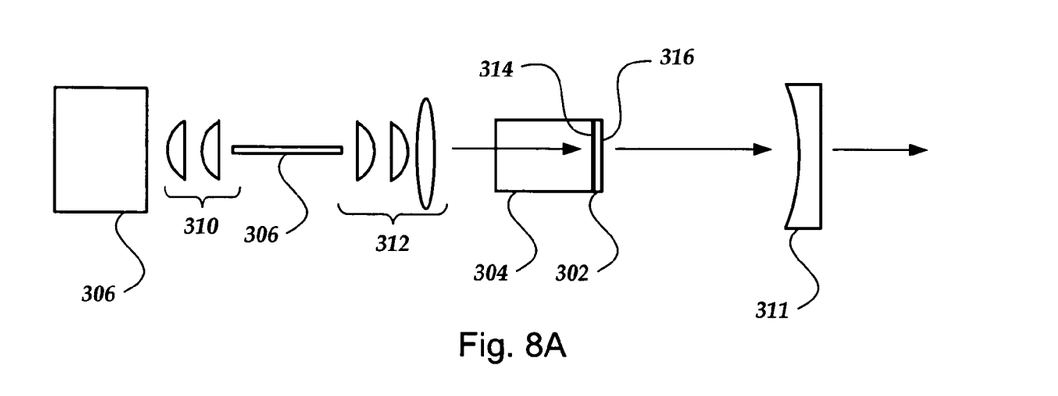
FIGS. 8A and 8B are schematic illustrations of two embodiments of laser systems, according to the invention.

A variety of lasers, including near infrared (NIR) lasers, can be formed using these materials, including, for example, lasers containing the arrangements schematically illustrated in FIGS. 6A, 6B, and 7. One example of a laser system that can be built as an all solid state compact laser with a thin laser medium disk is schematically illustrated in FIG. 8A. At the heart of the laser is a disk 302 disposed on a transparent heat sink 304 (e.g., a sapphire heat sink.) The disk is pumped with light from diode bars 306 (or any other suitable pumping light source.) For example, a laser diode stack consisting of a number bars can be used for pumping. Pumping light is delivered to the laser head by a planar waveguide 308. The radiation emitted by each bar was first collimated individually by a cylindrical microlens 310. A planar waveguide is used to shape the emitting beams of the laser diodes. Two cylindrical lenses 312 are used to focus the collimated diode laser beam into the planar waveguide. Using imaging optics, for example, cylindrical and spherical lenses, after the waveguide, a homogeneous pumping line is obtained and coupled onto the disk through the transparent heat sink 304. The dielectric mirror coatings 314, 316 on the disk itself define the resonator of the oscillator. The cooling face of the disk attached to heat sink is coated for high reflectivity at the laser wavelength and high transmission at the pumping wavelength, while the other side is high reflection coated for both wavelengths.

Figure 8B:
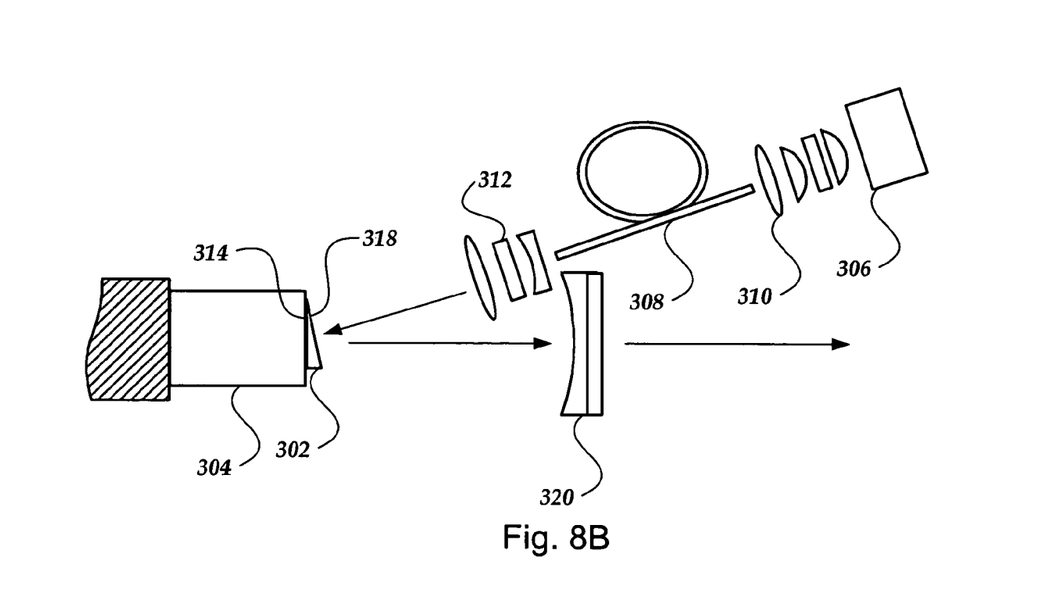

A second example is schematically illustrated in FIG. 8B, where a similar pump assembly (with laser diode bars 306, optics 310, 312, and waveguide 308) is used to pump a laser medium wedge 302 from its front surface. Heat management in the gain medium (wedge) is central to successful operation of this laser and is provided by a heat sink 304 (e.g., a copper heat sink.) The wedge 302 includes a high reflective coating 314 on the back side near the heat sink 304 and an antireflective coating 318 on the front side. A coupler 320 is provided with a 95% reflective coating at the laser wavelength.

Figure 9:
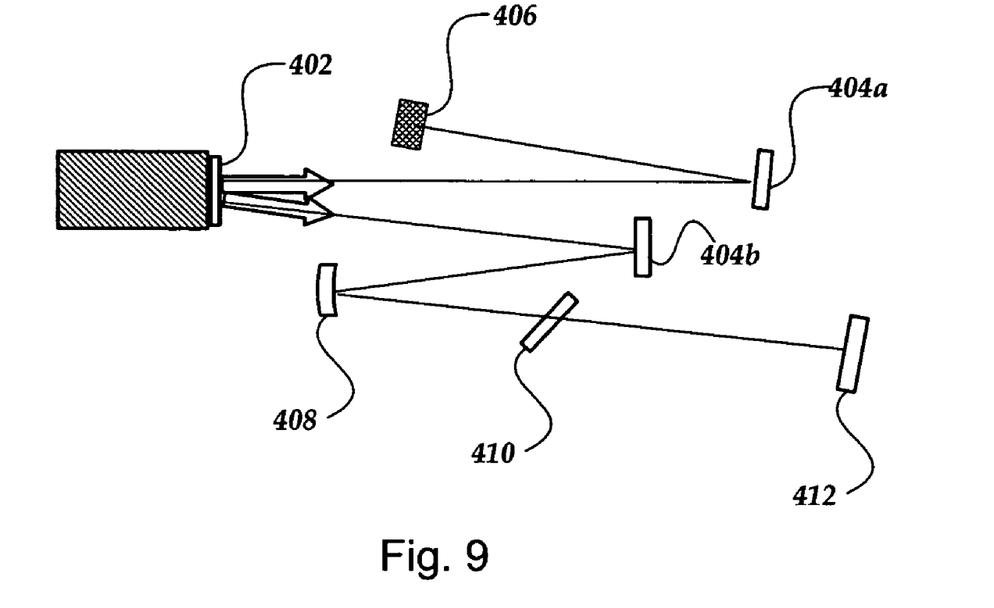
FIG. 9 is a schematic illustration of another embodiment of a laser system, according to the invention.

In another embodiment schematically illustrated in FIG. 9, for pulsed operation, the near-IR light from the laser head (e.g., laser disk 402) can then be directed through a series of dispersive mirrors 404a, 404b to a semiconductor saturable absorber mirror 406 that induces passive mode-locking. The laser light can pass through a mirror 408 and a tuning element 410 to an output coupler 412.

Figure 10:
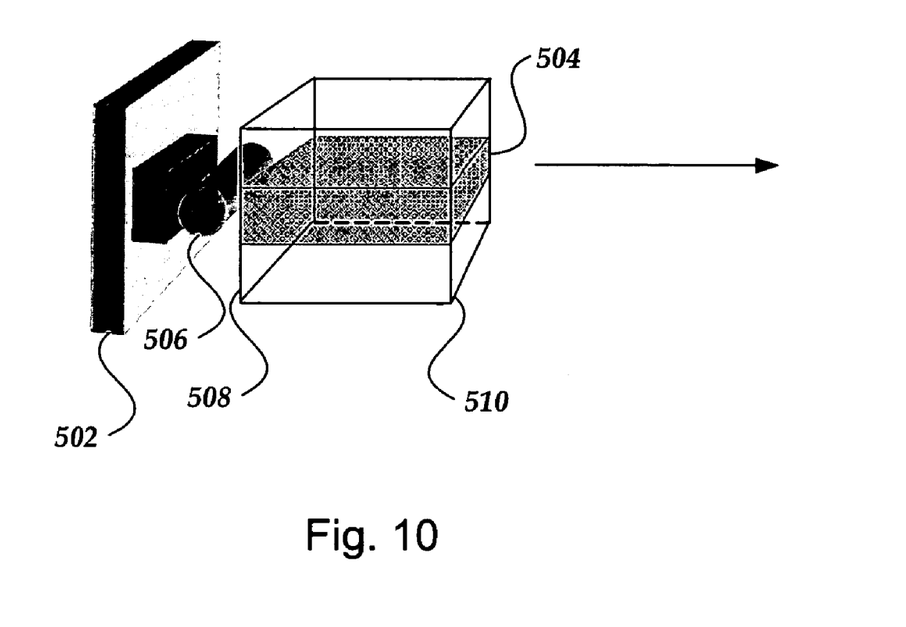
FIG. 10 is a schematic illustration of one embodiment of a waveguide laser/amplifier, according to the invention.

An example of a waveguide laser device is schematically illustrated in FIG. 10. A pump diode laser 502 provides pumping light through a coupling optic 506 to a waveguide 504 made of the $Cr^{3+}$ material described above. As an example, the waveguide has a coating 508 that is highly reflective at the laser frequency and highly transmissive at the pumping frequency and a second coating 510 that is 95% reflective at the laser frequency.

It will be recognized that these examples of lasers and waveguide laser devices can include more or fewer components or can be modified in accordance with known configurations of lasers and other devices.

The above specification, examples and data provide a description of the manufacture and use of the composition of the invention. Since many embodiments of the invention can be made without departing from the spirit and scope of the invention, the invention also resides in the claims hereinafter appended. The entire disclosure of each paper, patent, patent application, and other reference cited herein is incorporated herein by reference for all purposes.

What is claimed as new and desired to be protected by Letters Patent of the United States is:

1. A laser medium, comprising:
    a single crystal of chromium-doped $LiSc_{1-x}In_xGe_{1-y}Si_yO_4$, wherein $0 \leq x \leq 1$ and $0 \leq y \leq 1$ with the proviso that x and y are not both 0, wherein at least a portion of the chromium is in the form of $Cr^{3+}$ ions and the $Cr^{3+}$ ions are laser-active centers.
2. The laser medium of claim 1, wherein x is 1.
3. The laser medium of claim 2, wherein y is 0.
4. The laser medium of claim 1, wherein y is 0.
5. The laser medium of claim 1, wherein $0.1 \leq x \leq 1$.
6. The laser medium of claim 1, wherein a concentration of chromium is at least 1 wt. %.
7. The laser medium of claim 1, wherein at least 50% of the chromium is in the form of $Cr^{3+}$ ions.
8. A laser comprising:
    a laser medium comprising a single crystal of chromium-doped $LiSc_{1-x}In_xGe_{1-y}Si_yO_4$, wherein $0 \leq x \leq 1$ and $0 \leq y \leq 1$ with the proviso that x and y are not both 0, wherein at least a portion of the chromium is in the form of $Cr^{3+}$ ions and the $Cr^{3+}$ ions are laser-active centers; and
    at least one reflective element which is a least partially reflective at a laser frequency of the laser medium and is disposed to receive laser light from the laser medium.
9. The laser of claim 8, wherein the laser is a near infrared laser.
10. The laser of claim 9, wherein the laser has emission in the range of 1100 to 1600 nm.
11. The laser of claim 8, wherein the laser medium is a thin disk, thin slab, or thin wedge.
12. The laser of claim 11, wherein the thin disk or thin wedge has a maximum thickness in the range of 100 to 1000 μm.
13. The laser of claim 8, further comprising a heat sink attached to a surface of the laser medium.
14. The laser of claim 8, further comprising a pump light source configured and arranged to provide pumping light to the laser medium.
15. The laser of claim 8, further comprising a tuning element to tune a frequency of light emitted by the laser medium.
16. The laser of claim 8, wherein x is 1.
17. The laser of claim 16, wherein y is 0.
18. The laser of claim 8, wherein the laser is continuous-wave mode-locked.
19. A method of making a laser medium, the method comprising:
    forming a solution comprising at least one substituent for forming the laser medium disposed in a solvent, wherein the at least one substituent is selected from metal oxides, metal chlorides, and metal fluorides; and
    forming at least one crystal of chromium-doped $LiSc_{1-x}In_xGe_{1-y}Si_yO_4$ from the solution, wherein $0 \leq x \leq 1$ and $0 \leq y \leq 1$ with the proviso that x and y are not both 0.
20. The method of claim 19, wherein forming at least one crystal of chromium-doped $LiSc_{1-x}In_xGe_{1-y}Si_yO_4$ comprises forming the at least one crystal wherein the solvent comprises $Bi_2O_3$.
21. The method of claim 19, wherein forming at least one crystal of chromium-doped $LiSc_{1-x}In_xGe_{1-y}Si_yO_4$ comprises forming a layer of chromium-doped $LiSc_{1-x}In_xGe_{1-y}Si_yO_4$ on a substrate by liquid phase epitaxy using the solution.
22. The method of claim 19, wherein forming at least one crystal of chromium-doped $LiSc_{1-x}In_xGe_{1-y}Si_yO_4$ comprises forming at least one crystal of chromium-doped $LiSc_{1-x}In_xGe_{1-y}Si_yO_4$ wherein x is 1 and y is 0.
23. The laser medium of claim 1, wherein a concentration of chromium is in a range of 0.1 wt. % to 5 wt. %.

* * * * *